(12) United States Patent
De Coi et al.

(10) Patent No.: US 8,899,383 B2
(45) Date of Patent: Dec. 2, 2014

(54) ELEVATOR DOOR MONITOR AND DRIVE SAFETY APPARATUS

(75) Inventors: Beat De Coi, Sargans (CH); Dumeng Hersche, Bonaduz (CH); Jürg Hegelbach, Oberriet (CH); Tobias Leutenegger, Chur (CH)

(73) Assignee: Cedes AG, Landquart (CH)

(*) Notice: Subject to any disclaimer, the term of this patent is extended or adjusted under 35 U.S.C. 154(b) by 529 days.

(21) Appl. No.: 13/281,664

(22) Filed: Oct. 26, 2011

(65) Prior Publication Data

US 2013/0056309 A1 Mar. 7, 2013

Related U.S. Application Data

(60) Provisional application No. 61/531,405, filed on Sep. 6, 2011.

(30) Foreign Application Priority Data

Oct. 17, 2011 (EP) .................................. 11 008 339

(51) Int. Cl.
*B66B 1/34* (2006.01)
*H03K 17/968* (2006.01)
*B66B 13/22* (2006.01)

(52) U.S. Cl.
CPC .............. *B66B 13/22* (2013.01); *H03K 17/968* (2013.01)
USPC ......................................... 187/247; 187/391

(58) Field of Classification Search
CPC .... B66B 5/0018; B66B 5/0031; B66B 13/02; B66B 13/14; B66B 13/24

USPC .......... 187/247, 287, 289, 316, 317, 391–393
See application file for complete search history.

(56) References Cited

U.S. PATENT DOCUMENTS

| 4,034,275 | A | * | 7/1977 | Mangel .......................... 318/461 |
| 4,367,810 | A | * | 1/1983 | Doane et al. ................... 187/280 |
| 5,107,964 | A | * | 4/1992 | Coste et al. ..................... 187/280 |
| 5,387,769 | A | * | 2/1995 | Kupersmith et al. .......... 187/248 |
| 6,173,814 | B1 | * | 1/2001 | Herkel et al. .................. 187/288 |
| 6,193,019 | B1 | * | 2/2001 | Sirigu et al. ................... 187/391 |
| 6,467,585 | B1 | * | 10/2002 | Gozzo et al. ................... 187/391 |

(Continued)

FOREIGN PATENT DOCUMENTS

DE 10 2009 037 347 A1 2/2011
GB 876 371 A 8/1961

OTHER PUBLICATIONS

European Search Report dated Feb. 15, 2012.

*Primary Examiner* — Anthony Salata
(74) *Attorney, Agent, or Firm* — Burr & Brown, PLLC

(57) ABSTRACT

A safety apparatus for elevator apparatuses which can move a cab by way of a drive, including: a first safety circuit, which has a closed conduction state and an open conduction state, with an interrupting apparatus for interrupting the drive depending on the conduction state of the first safety circuit, a safety device, which includes at least two sensors, which can be switched between at least two switching states depending on the closing state of the elevator door. In order to be able to improve the susceptibility to maintenance, a switching unit is provided which can be switched between at least two switching states by connection to the safety device and is designed to effect the closed and/or open conduction state of the first safety circuit.

16 Claims, 7 Drawing Sheets

(56) References Cited

U.S. PATENT DOCUMENTS

| | | | |
|---|---|---|---|
| 7,252,180 B2 * | 8/2007 | Deplazes et al. | 187/393 |
| 7,334,665 B2 * | 2/2008 | Smith et al. | 187/247 |
| 7,650,970 B2 * | 1/2010 | Lelic et al. | 187/316 |
| 8,413,765 B2 * | 4/2013 | Stratmann | 187/247 |
| 8,430,212 B2 * | 4/2013 | Ueda et al. | 187/391 |
| 2011/0036668 A1 | 2/2011 | Stratmann | |
| 2013/0146398 A1 * | 6/2013 | De Coi et al. | 187/316 |
| 2013/0146399 A1 * | 6/2013 | De Coi et al. | 187/393 |

* cited by examiner

ELEVATOR DOOR MONITOR AND DRIVE SAFETY APPARATUS

FIELD OF THE INVENTION

The invention relates to a safety apparatus for elevator apparatuses, as well as a method for retrofitting an elevator apparatus and a retrofitting apparatus therefor.

BACKGROUND OF THE INVENTION

The prior art has disclosed conventional safety apparatuses for elevators which use electrical or electromechanical contacts and switches in order to determine the locking or closing state of an elevator door. The intention here is for an elevator cab to only be allowed to travel when all the doors are locked.

The object of the invention is to propose a safety apparatus and an elevator apparatus in which the susceptibility to the need for maintenance can be improved.

The object is achieved, starting from a safety apparatus and an elevator apparatus of the type mentioned at the outset.

SUMMARY OF THE INVENTION

By virtue of the measures mentioned hereinafter, advantageous developments and embodiments of the invention are possible.

Correspondingly, a safety apparatus for elevator apparatuses which can move a cab by means of a drive comprising: a first safety circuit, which has a closed conduction state and an open conduction state, with an interrupting apparatus for interrupting the drive depending on the conduction state of the first safety circuit, and an additional safety device, which comprises at least two sensors, which can be switched between at least two switching states depending on the closing state of the elevator door, is characterized by the fact that a switching unit is provided which can be switched between at least two switching states by connection to the safety device. In addition, the switching unit is designed to effect the closed and/or open conduction state of the first safety circuit. The interrupting apparatus serves the purpose of interrupting the drive, with the interruption being dependent on the nature of the switching states of the switching unit and furthermore other switches in the first safety circuit, i.e. on whether all of the doors are actually locked. This measure makes it possible to correspondingly improve the susceptibility to the need for maintenance and to increase the safety of the elevator.

If a plurality of doors is provided, travel can only be begun or continued when all of the doors are locked. Correspondingly, it is expedient if the corresponding sensors which are each assigned to a door are connected in series.

The first safety circuit has, for example, normally closed switches and a relay/contactor as the interrupting apparatus. The normally closed switches can be in the form of electromechanical switches in conventional safety circuits. If an open conduction state is effected, i.e. the first safety circuit is interrupted, the relay or the contactor also opens and interrupts a motor of the elevator, for example.

The safety device can to a certain extent be considered to be an equivalent circuit for individual normally closed switches or for all of the normally closed switches which monitor the closing state or locking state of the door. In principle, the safety device may also be a second safety circuit.

Correspondingly, in one embodiment of the invention, the safety device can be in the form of a second safety circuit which comprises at least two sensors which can be switched between at least two switching states depending on the closing state of the elevator door. However, the interrupting apparatus can be designed to interrupt and/or continue the drive, inter alia depending on the switching state of a switching unit (not of the sensor directly). The switching unit can in turn be switched between at least two switching states by connection to the safety circuit. The interrupting apparatus and the switching of the interrupting apparatus are therefore dependent on the safety circuit, but are not coupled directly to said safety circuit, but indirectly via an interposed switching unit. This apparatus makes it possible to a certain extent for the safety circuit or the arrangement of sensors to be "decoupled" as a separate apparatus. This can be advantageous in particular when an apparatus with comparatively high voltages is required for the interrupting apparatus. Such an apparatus is associated with corresponding disadvantages in terms of fitting and maintenance since there is the possibility that contact could be made with live parts carrying a relatively high voltage; these disadvantages can be circumvented with the safety apparatus according to the invention. The safety circuit itself can in principle be operated on relatively low voltages, however.

In addition, the sensors can in turn be connected in series. In particular, when such decoupling has taken place, it is possibly advantageous to identify a fault state of a sensor. In a conventional series circuit, however, it is in principle not possible to perceive which sensor might have been interrupted by a defect. In the case of a large number of sensors, this requires a corresponding amount of time and therefore also corresponding costs during maintenance. This can be counteracted by virtue of the fact that an indicator apparatus for indicating the switching state of the individual sensors with assignment of the individual switching states to the corresponding sensors is provided. In principle, a corresponding indicator apparatus is capable of indicating which of the sensors has which switching state at that time or which sensor does not have a specific switching state at that time, for example which sensor is open.

In particular, in a development of the invention, the safety device can also be in the form of a bus system, the sensors each having an electronics unit. In addition, the sensor is connected to the bus via its corresponding electronics unit. Such a bus makes it possible in particular to transmit and/or interchange data. For example, data of individual sensors can thus be read on command. In principle, a bidirectionally operating bus is conceivable in which data can be transmitted and received. In principle, however, a unidirectional bus is also conceivable. As data it is possible to transmit the switching states, but it is also possible for identification data of the sensors to be transmitted which give information on which sensor is the sensor in question. These identification data can also be addressings of the individual sensors, for example. This makes it possible, in a particularly elegant manner, to read which sensor is indicating a specific state at that time. In addition, bus systems can also operate particularly quickly, if appropriate.

In a preferred development of the invention, at least one of the sensors has the following construction: a sensor for safety apparatuses for elevator apparatuses which can move a cab by means of a drive, the sensor being in the form of an optical sensor which comprises a transmitter for transmitting an optical signal and a receiver for receiving the optical signal. A particularly advantageous feature of the sensor is that it can operate in contactless fashion, i.e. without any wear as well. In addition, the sensor therefore does not have any live contact areas, or only has a few live contact areas, and is furthermore safe during fitting. The sensor according to the invention can therefore replace a conventional switch, a so-called interlock switch, from the prior art. In addition, the sensor provides the possibility of there being no need for the circuit to be interrupted, in contrast to an electromechanical switch.

By virtue of the sensor, it is also possible to avoid a defect which can occur, for example in the case of electromechanical sensors and contacts, as a result of contact erosion owing to flashover during opening or closing of the electrical contacts and can ultimately result in a loss of function.

Owing to the fact that the circuit does not need to be interrupted with this sensor, in contrast to a switch, improved diagnosis in the case of defects is advantageously possible.

In addition, a contact bridge and a contact receptacle for receiving the contact bridge are provided which are arranged in such a way that the closing state of the elevator door can be determined by connection of the contact receptacle and the contact bridge. The detection state of the sensor is therefore dependent on the proximity of the contact bridge to the contact receptacle.

An elevator itself generally has firstly a cab which can be moved between individual stories or floors. The individual floors each have shaft openings, in the region of which the cab can be moved into a stop position when said cab is intended to travel to the corresponding floor. In this stop position, access to the cab is then enabled. This access can be enabled by virtue of the elevator doors being opened and then closed again and locked prior to continued travel of the elevator. Elevator doors may be shaft doors or cab doors. The shaft doors are fitted or mounted movably on the shaft itself in the region of the shaft opening. The cab doors are in turn fitted or mounted movably on the cab. In general, in each case one cab door is assigned to a shaft door, with the two being arranged so as to overlap one another (so as to overlap one another at least partially) in the stop position. Generally, said doors are also moved at least substantially synchronously.

In order that a journey in the cab can be begun or that the cab can continue to travel, it is necessary for all of the doors to be closed and locked. This can be checked by means of corresponding safety apparatuses which can possibly stop the drive by means of an interrupter apparatus. In principle, the interrupting apparatus or interruption circuit can activate the monitoring unit, i.e. controller or regulator, of the motor or the drive, with the result that said monitoring unit stops the drive; it is also conceivable for the interrupting apparatus to directly interrupt the power supply to the drive/motor.

The corresponding sensor is therefore designed to check whether the corresponding door of an elevator or a shaft is open or closed and locked. In the present case, it is particularly advantageous for the sensor to have a similar design to a plug-type connection, with the result that a contact bridge can engage in a contact shaft. In addition, this measure provides the possibility of an apparatus which is mechanically very stable. In principle, the sensor can be designed in such a way that the contact bridge is accommodated in the shaft of the contact receptacle with play or in interlocking fashion.

In addition, the contact bridge is designed in such a way that it comprises at least one transmission element for transmitting an optical signal. This advantageously makes it possible in particular to achieve a so-called failsafe circuit. Only when the contact bridge has reached a particular position by corresponding connection to the contact receptacle when the door is closed, is it possible for corresponding enabling for travel to be issued. In the case of simply a light barrier, this would in principle not be the case: the transmission element can be designed in such a way that the transmission of the optical signal takes place in a particular way which can only be manipulated with considerable difficulty and can also not readily be realized by accident. In the case of a simple light barrier, for example, which would be interrupted when the door is closed, this would mean that the drive would also be enabled when, for example, a corresponding object, a fly or the like interrupts the light barrier.

A further option is to arrange the transmitter or the receiver on the contact receptacle. The transmission of light by means of the transmission element can then only take place via the contact bridge. This design enables a particularly compact construction.

One possibility consists in designing the transmission element as a reflective surface, with this reflective surface then reflecting the optical signal or the light and only in this way guiding it onto the corresponding receiver. The reflective surface can be arranged in a notch in the contact bridge, for example. However, it is also conceivable for the transmission element to be an optical medium. It is conceivable, for example, for the light refraction to be utilized in the transition from the air into this optical medium and the light beam is therefore directed in a certain direction, with the result that only then is it guided either onto the receiver or not onto the receiver.

In addition, a fiberoptic conductor can be provided as optical medium. The optical signal is transmitted when the light from said signal is coupled into the fiberoptic conductor, propagates through the fiberoptic conductor and passes into the receiver via the fiberoptic conductor.

It is particularly advantageous to design the transmitter as a light-emitting diode and/or the receiver as a photodiode. Particularly cheap standard electronic components can be used; this results in the possibility of particular cost savings.

Moreover, it is also conceivable for the contact receptacle to comprise transmission elements for transmitting the optical signal, for example reflective surfaces or optical media such as fiberoptic conductors, for example. It is conceivable for a subsection of the propagation path of the optical signal from the transmitter to the receiver to be over a reflective surface or through a fiberoptic conductor in the contact receptacle. It is also conceivable for the fiberoptic conductor in the contact receptacle or in the contact bridge to be shifted, by virtue of the contact bridge being received, in such a way that transmission of the light is enabled.

Furthermore, the sensor can comprise an electronics unit for the evaluation of the receiver, said electronics unit being designed to interpret the evaluation of the receiver in one of the switching states and/or into an electrical signal. This means that the electronics unit is designed to generate an electrical signal or produce an electrical contact. However, since the mechanical closing state is detected purely optically, this means that it is not absolutely necessary for a mechanical contact or a mechanical opening state to be produced in order to produce an electrical signal. It is conceivable, for example, for the optical signal to enable the receiver, for example a photodiode, and therefore for it to be possible for a conduction state to be reached (in contrast to an interruption). As a result, an interpretation of the switching state of the sensor is performed electronically to a certain extent. However, the electronics unit can also additionally be designed to enable a connection to further electronics. For example, it can also be designed to enable a connection to a bus. This design makes it possible in particular to improve the relatively low susceptibility to the need for maintenance even further since mechanical contacts and sensors are substantially avoided. It is also particularly advantageous that it is merely necessary for the contact bridge to enter the contact receptacle as the mechanical contact closure.

In order that no parasitic light passes accidentally from the transmitter into the receiver, an isolating web for optically isolating the transmitter and the receiver can also be provided. This once again reduces in principle the possibility of errors occurring as a result of an incorrect interpretation of the signals. In addition, a diffuser can moreover also be provided, said diffuser distributing parasitic light diffusely. It is also conceivable for the receiver to be set during the detection to a certain threshold value as regards the intensity of the incident light, with the result that, in the case of a certain amount of parasitic light which possibly enters the receiver, a corresponding sequential signal which should only be resolved when light enters the receiver via the transmission element is nevertheless not triggered.

A connection can be produced so as to be particularly robust, for example, in which the contact receptacle comprises a shaft and the contact bridge comprises a tongue-shaped lug, which engages in the shaft during connection of contact bridge and contact receptacle. It is particularly advantageous here also that corresponding coding can be performed, i.e. the contact bridge, in a similar way to a key, needs to be provided with a particular design in order for it to be able to enter the contact receptacle. In particular, this can increase the safety of this apparatus, in particular when the contact receptacle shaft is designed in such a way that it is not possible for a hand to gain access.

It is likewise possible in the case of a corresponding sensor to provide at least two transmission elements which are arranged in series in the movement direction of the contact bridge, which means that, when the door is locked, the contact bridge dips correspondingly into the contact receptacle and is initially visible for the optical signal and the optical light beam of one of the transmission elements (namely the first transmission element in the movement direction). As the movement progresses, the next transmission element then becomes visible, while the previous transmission element is pushed out of the optical path. It is thus possible for a plurality of optical signals to occur with a temporal offset. In addition, it is conceivable to design the electronics unit or to pass on the corresponding signals to a further evaluation unit so that the occurrence of the corresponding signals is determined as a function of time, for example. It is thus possible for conclusions to be drawn in respect of the speed of the locking process. This also makes it possible to draw a conclusion in respect of the functional and maintenance state of the locking device of the doors. In principle, the locking process and not the door lock is moreover monitored. Depending on the way in which the corresponding transmission elements are arranged and how many of the transmission elements are arranged, the precision of such a determination can possibly be increased.

In principle, the first safety circuit can also furthermore have electromechanical normally closed switches. Said switches are possibly intended to be retained in an existing elevator system, for example, and not to be correspondingly replaced by optical sensors during retrofitting, for example. Optical sensors can be provided in particular for checking the correct locking of elevator doors. If the elevator is intended to be stopped during its movement even when the locking has not been correctly performed, however, but there is another fault, electromechanical normally closed switches can also continue to be used for checking such faults, if appropriate.

The sensors and/or normally closed switches can be connected in series in order for the drive to be stopped in the event of an interruption. Therefore, the circuit corresponds to an AND circuit, i.e. the motor only runs when all of the sensors or normally closed switches complete the circuit and do not interrupt the line.

Likewise, a corresponding indicator apparatus can be provided which makes it possible, for example, to identify which of the sensors has a specific switching state at that time and is possibly defective.

Furthermore, the sensor can comprise an electronics unit for the evaluation of the receiver, said electronics unit being designed to interpret the evaluation of the receiver in one of the switching states and/or into an electrical signal. This means that the electronics unit is designed to generate an electrical signal or produce an electrical contact. However, since the mechanical closing state is detected purely optically, this means that it is not absolutely necessary for a mechanical contact or a mechanical opening state to be produced in order to produce an electrical signal. It is conceivable, for example, for the optical signal to enable the receiver, for example a photodiode, and therefore for it to be possible for a conduction state to be reached (in contrast to an interruption). As a result, an interpretation of the switching state of the sensor is performed electronically to a certain extent. However, the electronics unit can also additionally be designed to enable a connection to further electronics. For example, it can also be designed to enable a connection to a bus. This design makes it possible in particular to improve the relatively low susceptibility to the need for maintenance even further since mechanical contacts and sensors are substantially avoided. It is also particularly advantageous that it is merely necessary for the contact bridge to enter the contact receptacle as the mechanical contact closure.

In one development of the invention, the electronics unit is for communication with a switching unit, in particular for transmission of switching states and/or identification signals. The switching unit is a component part which can be used to open or close a line by virtue of a switching operation, in a similar way to in the case of a relay or contactor. However, the switching operation is triggered when a corresponding signal or a corresponding item of information is passed on to the switching unit from the sensors. In particular, it is advantageous that the line between the switching unit and the sensor no longer needs to be interrupted, as is often the case in the case of a contactor/relay, for example.

The electronics unit can in particular be arranged in or on the contact receptacle in which the transmitter and receiver are also arranged. The contact receptacle can be arranged, for example statically, in the elevator apparatus, while the contact bridge is arranged on a moving part and merely represents the "key" in order to enable signal transmission in the contact receptacle.

A sensor can comprise precisely two terminals which are used firstly for power supply and secondly for communication with the electronics unit. The same line which is also used for power supply is therefore used for the communication. This measure enables a particularly compact and inexpensive design. In addition, this means that no additional lines or terminals need to be laid during retrofitting, when a conventional sensor is replaced by a sensor according to the invention, for example.

In addition, in the case of a sensor the communication can take place via modulation of its internal resistance of the sensor. In the circuit with the switching unit, the voltage and/or the current intensity can thus be modulated depending on the circuitry. This modulation then carries the information which is intended to be transmitted during the communication. For example, a circuit which comprises sensors connected in series and a switching unit (likewise connected in series) is conceivable. If the resistance of a sensor in the case of sensors connected in series is changed, the current intensity changes. If, for example, a constant current source is used for the circuit, a change in the resistance has the effect that the voltage needs to be increased in order to compensate for the resulting reduction in the current intensity which is initially caused by the lower resistance. The modulation can therefore act as an information carrier. The changes in the current intensity or voltage can be measured and can be interpreted as information.

In turn, in one development of the invention, the switching unit is designed to perform the communication with the sensors by modulation of the current intensity or the voltage. This measure can be performed by virtue of changes in resistances or corresponding changes in or matching of voltage or current intensity.

In the case of a series circuit, it is particularly advantageous if the sensor has a low transfer resistance. The resistance of a sensor can be, for example, in the range of from 1 ohm to 100 ohms, in particular in the range of from ohms to 20 ohms, preferably less than 10 ohms. Precisely in the case of a series circuit, it is advantageous to design the transfer resistance to be as low as possible, in particular lower than 10 ohms, in order that the voltage drop across the sensor is not excessively high.

Correspondingly, in addition an elevator apparatus according to the invention with a cab and at least one elevator door for opening and/or closing the cab and with a safety apparatus is characterized by the fact that a safety apparatus according to the invention are provided. As a result, the above-explained advantages can be used directly, inter alia.

It is conceivable in particular for the contact bridge to be fitted to an elevator door and for the contact receptacle to be fitted to the cab itself. In principle, however, a reverse design is also conceivable, namely the contact receptacle on the elevator door and the contact bridge on the cab. Similarly, the contact bridge and the contact receptacle can also be arranged on the shaft door and on the shaft or the shaft frame.

The contact receptacle itself can furthermore have a housing with fitting elements and the above-described insertion slot for the contact bridge. The electronics unit can be equipped with a light-emitting diode (LED) as fiberoptic conductor printed circuit board (PCB) and is equipped with a corresponding photodiode as receiver. The isolating web can correspondingly be arranged between the transmitter and the receiver. In addition, it is also conceivable for corresponding contacts, for example for making contact with the photodiode, to enable a connection to a corresponding electronics unit. The electronics unit can also be provided as a separate component part or so as to be integrated in another part of the elevator. In principle, the optical contact between the transmitter and the receiver can be converted into an electrical signal to a certain extent. In turn, the contact bridge can have a mounting plate, namely a corresponding tongue with optical fibers, wherein in this case the corresponding optical fibers can conduct light from the LED to the photodiode when the tongue is inserted. If appropriate, the corresponding parts can in particular also be prefitted.

A particular advantage of the subject matter according to the invention is that virtually no live contact areas are provided, i.e. fitting is very safe. The evaluation of the speed of the increase in illumination at the photodiode or the sequence of light pulses of two light transmission elements makes it possible to draw a conclusion in respect of the speed of the locking of the door with reference to the maintenance state. In addition, items of information relating to the maintenance state or the aging of the apparatus can thus be determined. In addition, an evaluation of the final illumination intensity can be performed in connection with the development of the illumination over time. This can make it possible in particular to draw a conclusion with regard to the insertion depth and also the locking safety. A plurality of transmission elements also enable dynamic detection. In addition, it is conceivable to increase the robustness by virtue of providing design measures which envisage the LED or the photodiode being covered. Precisely the design of a contact receptacle in the form of a shaft makes this particularly advantageously possible.

As has already been mentioned, a separate evaluation unit can be provided which can communicate with the corresponding bus via an interface, for example. A particular advantage of the apparatus according to the invention is that no interruption of an electrical contact is envisaged, but merely transmission of a signal optically is enabled or prevented.

A further advantage of the invention consists in that the apparatus according to the invention can be retrofitted particularly easily. In an existing elevator system, until now it has been particularly disadvantageous that virtually all of the sensors in the individual stories need to be investigated separately in the event of a defect in one sensor. In addition, it may not be possible to identify whether the defect is in a single sensor or a plurality of sensors, with the result that all of the sensors may need to be checked. The states of the sensors, i.e. defective or not or open or not, can be indicated centrally via an evaluation unit also in a convenient manner using a computer, control panel or the like.

In a corresponding retrofitting method according to the invention, the safety device can be used as a replacement part. The connection to the normally closed switches, for example conventional electromechanical switches, can be capped. Instead, the switching unit of the safety device is connected. In the case of elevators, the retrofitting complexity can therefore be considerably reduced. It is generally sufficient to draw in a relatively long connecting line over the stories. Both lines to the old normally closed switches can in addition usually be capped in uncomplicated fashion at a location in the vicinity of the control center.

In connection with the retrofitting, a retrofitting apparatus is installed in a corresponding elevator apparatus which is to be retrofitted, the elevator apparatus having a safety circuit which, in the context of the invention, corresponds to the first safety circuit and has normally closed switches. The retrofitting apparatus according to the invention comprises sensors which can be switched between at least two switching states depending on the closing state of the elevator door. Furthermore, the retrofitting apparatus comprises a switching unit which can be used instead of the normally closed switches which are intended to be replaced. The switching unit can be switched by means of the sensors. The sensors and the switching unit can interchange information, for example via modulation of the voltage/current intensity or the internal resistance of the sensors.

BRIEF DESCRIPTION OF THE DRAWINGS

Exemplary embodiments of the invention are illustrated in the drawings and will be explained in more detail below with further details and advantages being given.

Specifically, in the drawings.

DETAILED DESCRIPTION OF THE INVENTION

Figure 1:
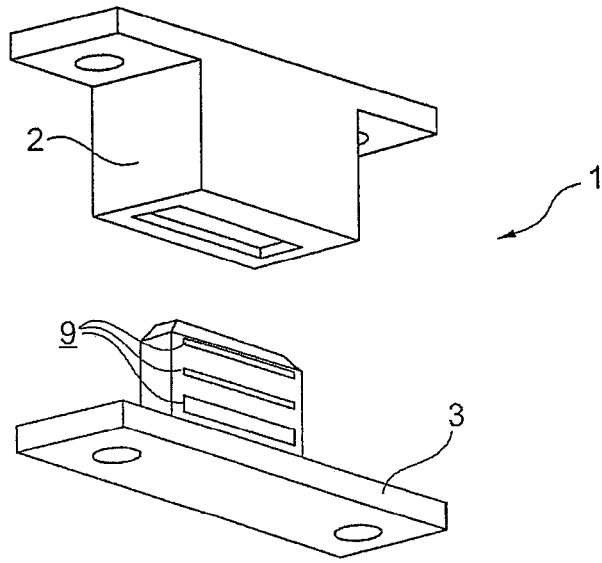
FIG. 1 shows a sensor comprising a contact bridge with reflective strips and a contact receptacle in accordance with the invention.

FIG. 1 shows a sensor 1 with a contact receptacle 2 (shaft) and a contact bridge 3, the contact bridge having reflective strips 9, which reflect light emitted from a transmitter of the contact receptacle 2 in the direction of a receiver of the contact receptacle 2.

Figure 2:
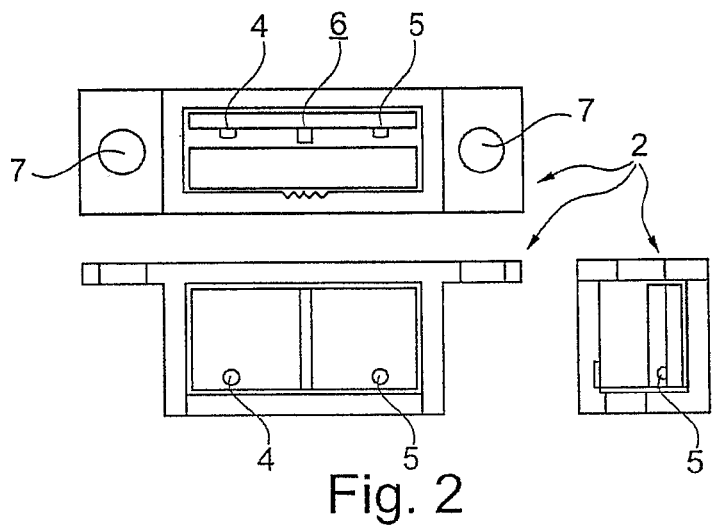
FIG. 2 shows a contact receptacle in accordance with the invention.

In turn, FIG. 2 shows the corresponding contact receptacle 2 with a transmitter 4 and a receiver 5, with an isolating web 6 being arranged between said transmitter and said receiver, to be precise in a front view, a side view and a plan view. Fitting apparatuses or fitting aids are indicated by the reference symbol 7. The contact receptacle 2 has additional electrical terminals, via which the sensor 1 can be connected to the rest of the sensor apparatus or to the safety circuit.

Figure 3:
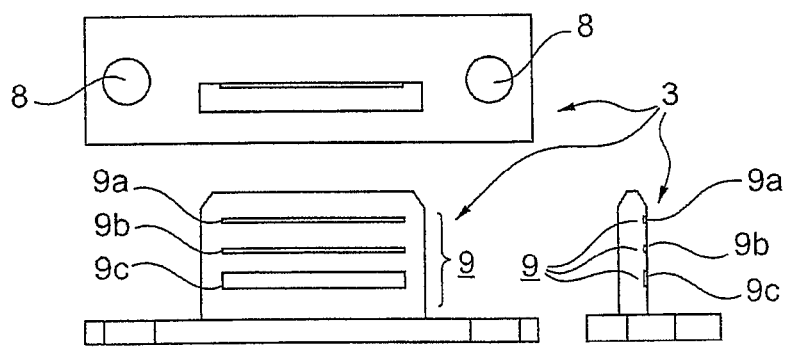
FIG. 3 shows a contact bridge with reflective strips in accordance with the invention.

FIG. 3 shows a contact bridge in different views, to be precise in a front view, a side view and a plan view. Said contact bridge also comprises corresponding fitting aids 8. Slots are incorporated into the contact bridge 3 as transmission elements 9, said slots each having reflective surfaces. In total there are three reflection units 9a, 9b, 9c, with the result that dynamic contact detection is enabled to a certain extent since first the reflection unit 9a, then the reflection unit 9b and finally 9c enter the contact receptacle 2 or the optical path when the contact bridge 3 is inserted and therefore dynamic measurement of the signal with temporal dependence is possible.

Figure 4:
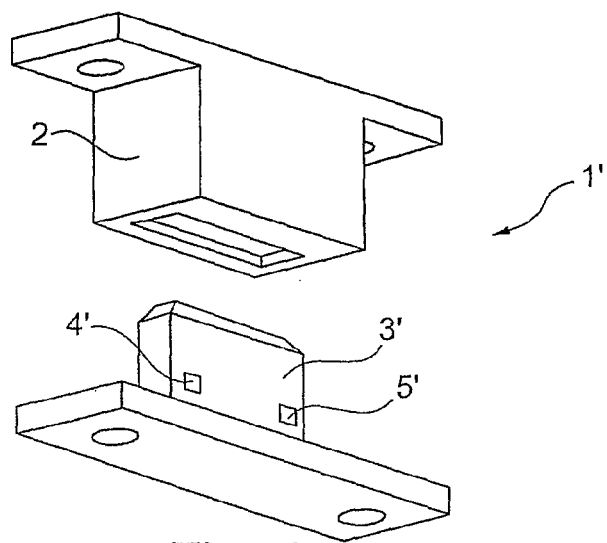
FIG. 4 shows a sensor comprising a contact bridge with a fiberoptic conductor and a contact receptacle in accordance with the invention.

FIG. 4 shows a sensor 1' with a contact receptacle 2 (shaft) and a contact bridge 3', the contact bridge having a fiberoptic conductor; the light emitted by a transmitter of the contact receptacle 2 passes into the fiberoptic conductor inlet 4', propagates through the fiberoptic conductor and emerges from the fiberoptic conductor outlet 5' again, with the result that it passes to the receiver of the contact receptacle 2.

Figure 5:
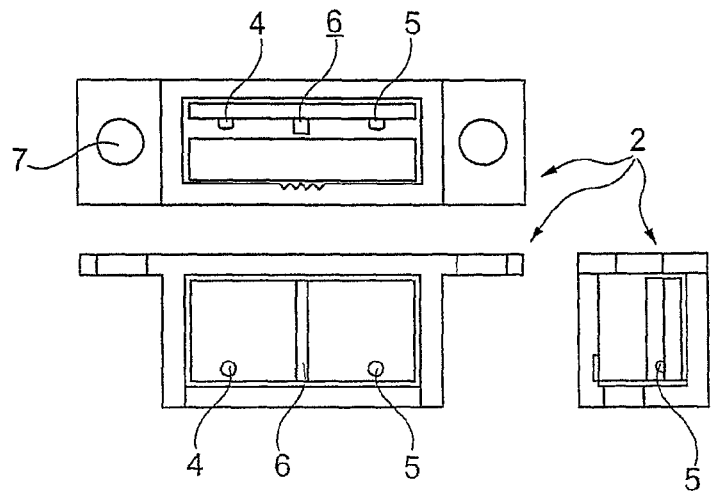
FIG. 5 shows a contact receptacle in accordance with the invention, as in FIG. 2.

In turn, FIG. 5 shows the corresponding contact receptacle 2, as has already been described in relation to FIG. 2, said contact receptacle also being suitable for a sensor 1' with a fiberoptic conductor.

Figure 6:
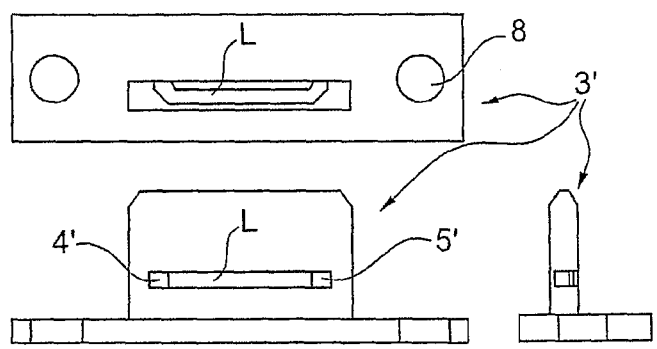
FIG. 6 shows a contact bridge with a fiberoptic conductor in accordance with the invention.

FIG. 6 shows a contact bridge 3' in different views, to be precise in a front view, a side view and a plan view. Said contact bridge also comprises corresponding fitting aids 8. A fiberoptic conductor is incorporated into the contact bridge 3' as transmission element L and the light signal transmitted by the contact receptacle can propagate through said fiberoptic conductor. The figure also shows the light inlet 4' and the light outlet 5'.

Figure 7:
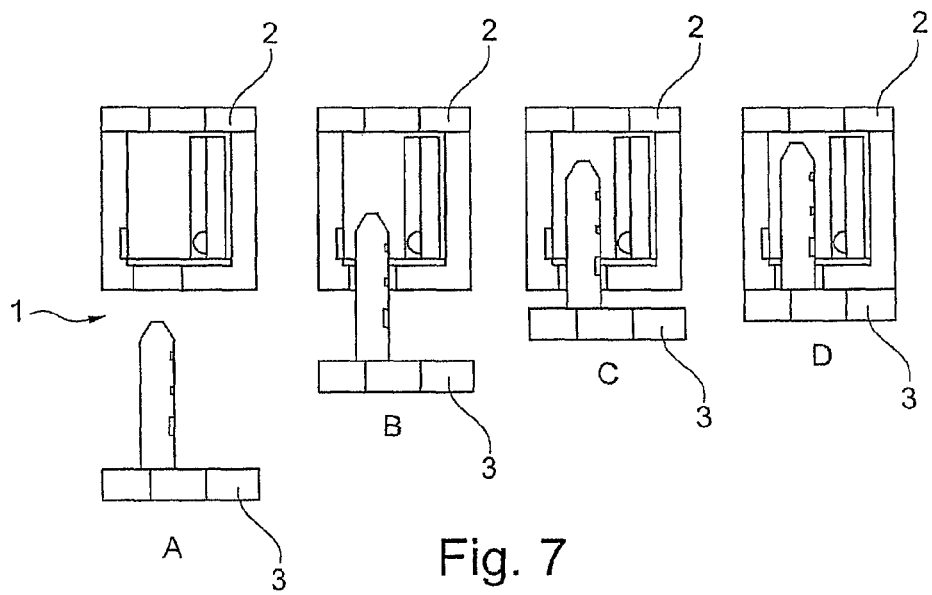
FIG. 7 shows the connection (temporal sequence) of the contact bridge and contact receptacle in accordance with the invention.

FIG. 7 shows the contact bridge 3 (with reflective strips) entering the contact receptacle 2 in this way, with the contact bridge not yet being connected to the contact receptacle 2 in situation A. In situation B, the reflection unit 9a has just entered in the region of the optical path and transmits the light path from the transmitter to the receiver. In situation C, the contact bridge 3 is positioned at this time such that the optical signal is interrupted since the contact bridge 3, in terms of its height, is precisely between the reflection units 9b and 9c and the optical path is therefore interrupted. Only in situation D is the contact bridge, which has been completely inserted into the contact receptacle 2, in such a position that the optical path is not interrupted and light can pass from the receiver 4 into the detector/photodiode via the reflection element 9c. The reflection units 9, and also other transmission units such as optical media, can have different forms and provide characteristic reflections or light transmissions, with the result that these can each be identified, if appropriate, by means of the receiver or the electronics unit as well.

Figure 8:
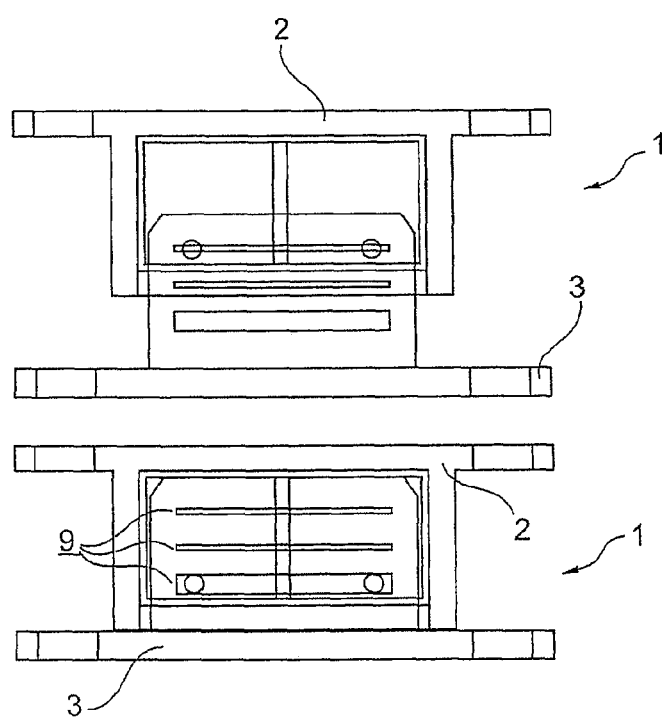
FIG. 8 shows a sensor with reflective strips in accordance with the invention.

FIG. 8 shows a similar illustration in which the contact bridge 3 enters the contact receptacle 2.

Figures 9, 10:
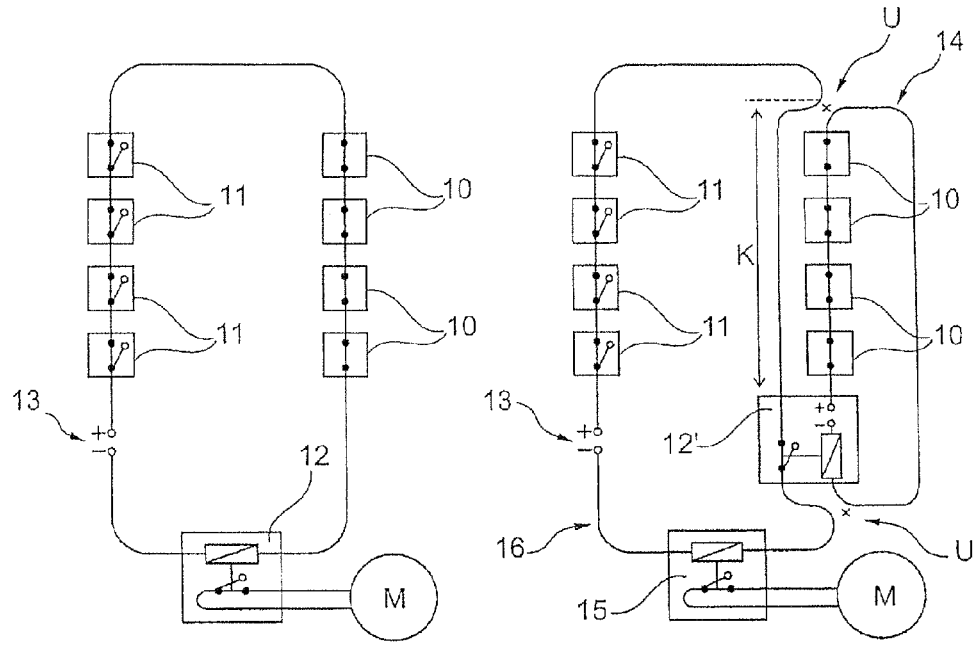
FIG. 9 shows a safety apparatus with sensors in accordance with the invention.
FIG. 10 shows a safety apparatus with a safety circuit in accordance with the invention.

In turn, FIG. 9 shows a safety apparatus with a plurality of optical sensors 10, which are all connected in series. Furthermore, a series of further electromechanical normally closed switches 11 is provided which can otherwise be used in connection with an elevator. In addition, a voltage source 13 is provided. All of these switches or sensors 11 and 10 are connected in series and are connected to a switching unit 12. This circuit comprising a series circuit comprising the switches 11, the sensors 10 and the switching unit 12 forms a safety circuit. If one of the switches 11 is interrupted, the entire circuit is interrupted, and the switching unit 12 disconnects the motor M, which represents the drive for the elevator cab. The switches 11 can be normally closed switches of the known type. If one of the sensors 10 detects that the elevator has not been locked properly, for example, said sensor transmits a corresponding signal via the circuit, and this signal is received by the communication unit of the switching unit 12, with the result that said unit can disconnect the motor M. Correspondingly, the switching unit 12 partially takes over the function of your relay; in addition, switching operations of the switching unit are also dependent on signals from the sensors, however. The switching unit 12 therefore does not only respond to line interruptions.

FIG. 10 shows a safety apparatus with a safety device, namely a (second) safety circuit 14, with corresponding optical sensors 10. This safety circuit is connected to the first safety circuit 16 via a switching unit 12', said first safety circuit in turn having further sensors 11. The switching unit 12' is similar to the switching unit 12 and has the same mode of operation; in this case, in contrast to the switching unit 12 shown in FIG. 9, however, the voltage source is also integrated in the switching unit 12'. A contactor/relay 15, which can in turn disconnect a drive M, is located in the first safety circuit 16. The contactor 15 is merely designed to disconnect the motor M in the event of a line interruption in the circuit 16. If one of the sensors 10 is interrupted optically, the switching unit 12' is also interrupted, and therefore the line in the first safety circuit 16. The contactor 15 disconnects the motor M. Instead of the conventional normally closed switches, the sensors according to the invention are combined in a dedicated safety circuit 14 and are connected to the original, first safety circuit 16 via the switching unit 12'. The safety circuit 16 can in this case partly use the wiring of the original safety apparatus.

In addition, FIG. 10 illustrates how retrofitting of a conventional apparatus can be performed by virtue of the original first safety circuit 16 being capped at the points U and the second safety circuit 14 with the switching unit 12' being used correspondingly. It is then only necessary for a relatively long cable K to be drawn in.

Figures 11, 12:
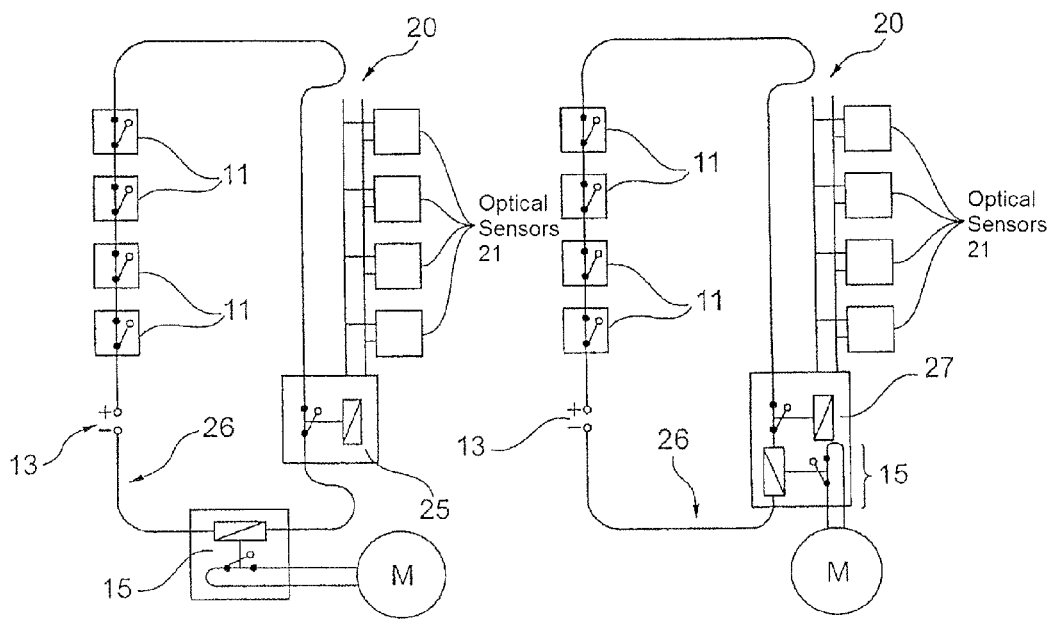
FIG. 11 shows a safety apparatus with a bus in accordance with the invention.
FIG. 12 shows a safety apparatus with a bus and an integrated contactor in the switching unit in accordance with the invention.

FIG. 11 shows a corresponding apparatus in which, instead of a second safety circuit, a bus 20 is arranged as the safety device. The corresponding sensors 21 have an electronics unit which enable a connection to the corresponding bus 20. The bus is likewise connected to a switching unit 25, with the result that when one of the optical sensors 21 is interrupted, said sensor in turn transmits a signal to the switching unit 25 which in turn interrupts the first safety circuit 26. Owing to the interrupted line of the safety circuit 26, the motor M is disconnected by the contactor 15. The switching unit 25 can form the master in the bus, for example, while the sensors 21 have a slave configuration.

FIG. 12 shows a similar apparatus to that shown in FIG. 8, but in this case the contactor 15 is additionally integrated in the switching unit 27, with the contactor disconnecting the motor, if appropriate.

Figure 13:
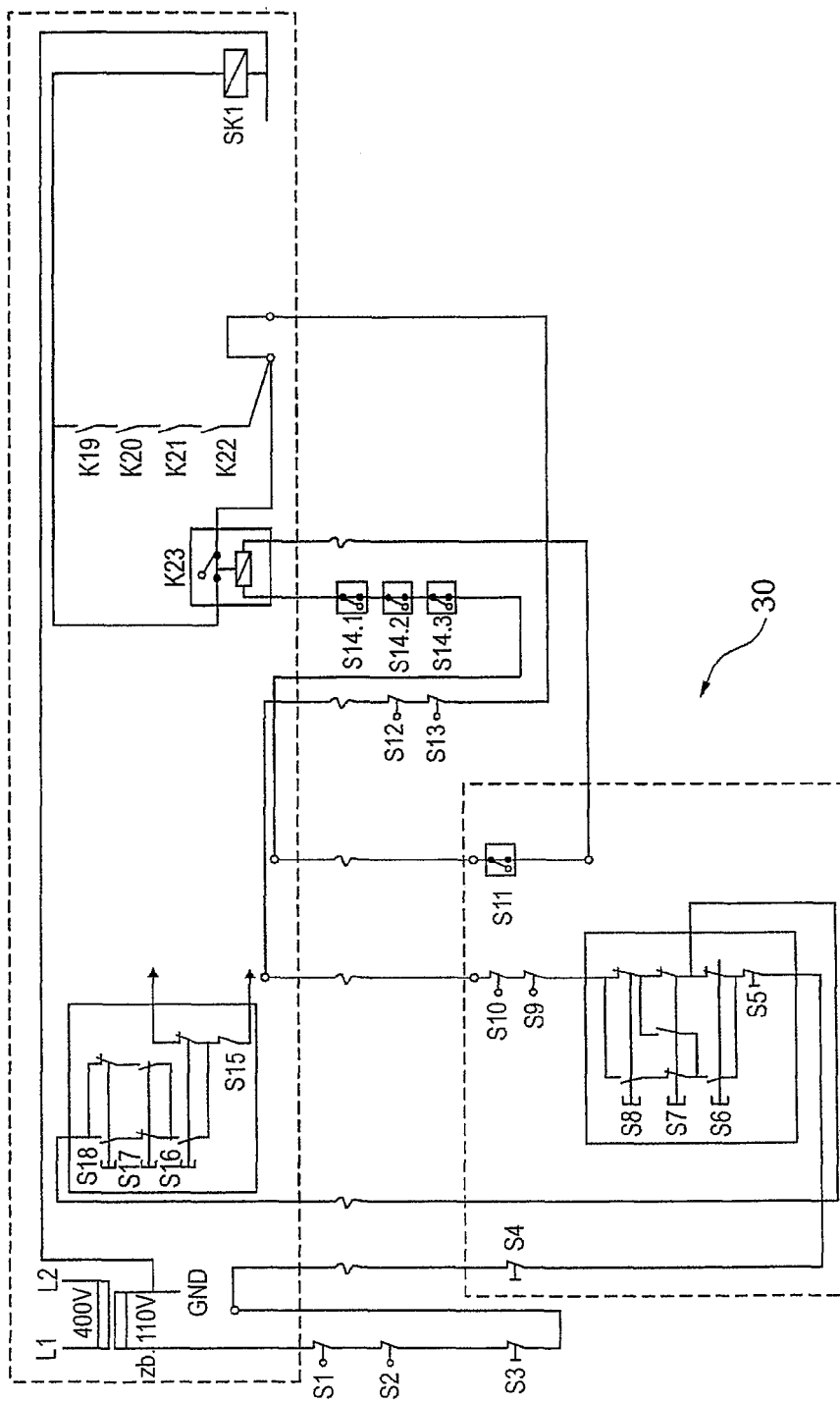
FIG. 13 shows a circuit diagram for an elevator in accordance with the invention.

FIG. 13 shows an exemplary circuit diagram 30 for an elevator in accordance with the invention.

Figure 14:
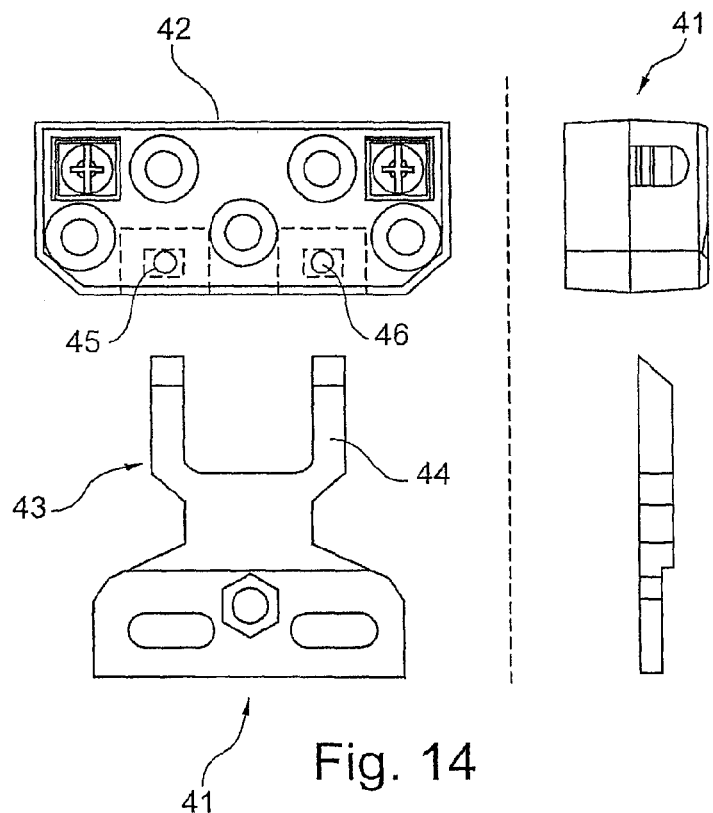
FIG. 14 shows a sensor with fiberoptic conductors in accordance with the invention.
Figure 15:
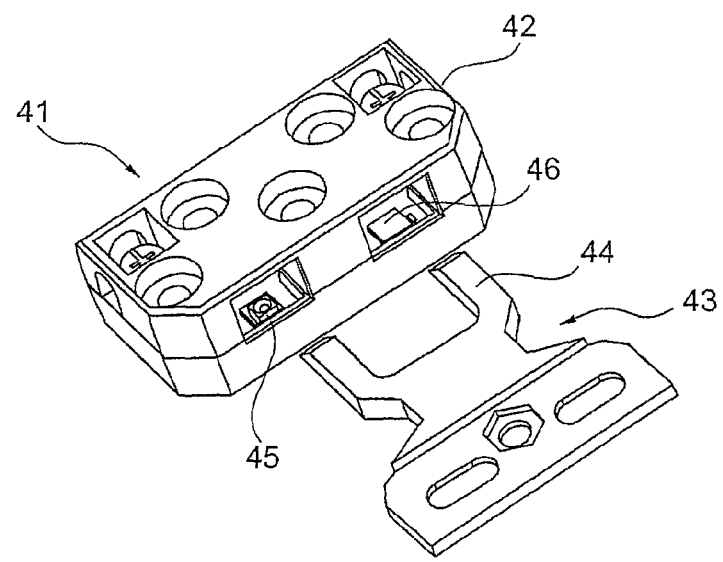
FIG. 15 shows a perspective view of the sensor shown in FIG. 14.

FIG. 14 shows a sensor 41 in a plan view and in a side view with a contact receptacle 42 and a contact bridge 43, in which a fiberoptic conductor 44 is arranged. In this case, the contact bridge 43 is overall in the form of a fiberoptic conductor 44, i.e. consists of the corresponding optical medium. The contact receptacle 42 comprises a transmitter 45 and a receiver 46 for transmitting/receiving optical signals. The optical signal transmitted by the transmitter 45 can propagate through the fiberoptic conductor 44, as soon as the contact receptacle 42 has received the contact bridge 43, and therefore passes into the receiver 46. The contact bridge 43 (or the fiberoptic conductor 44) is in the form of a U and, when it is plugged into the contact receptacle 42, engages only with both limbs in the two shafts of the contact receptacle 42. The fiberoptic conductor 44 correspondingly likewise has a U-shaped design. FIG. 15 in turn shows the sensor 41 in a perspective view.

Figure 16:
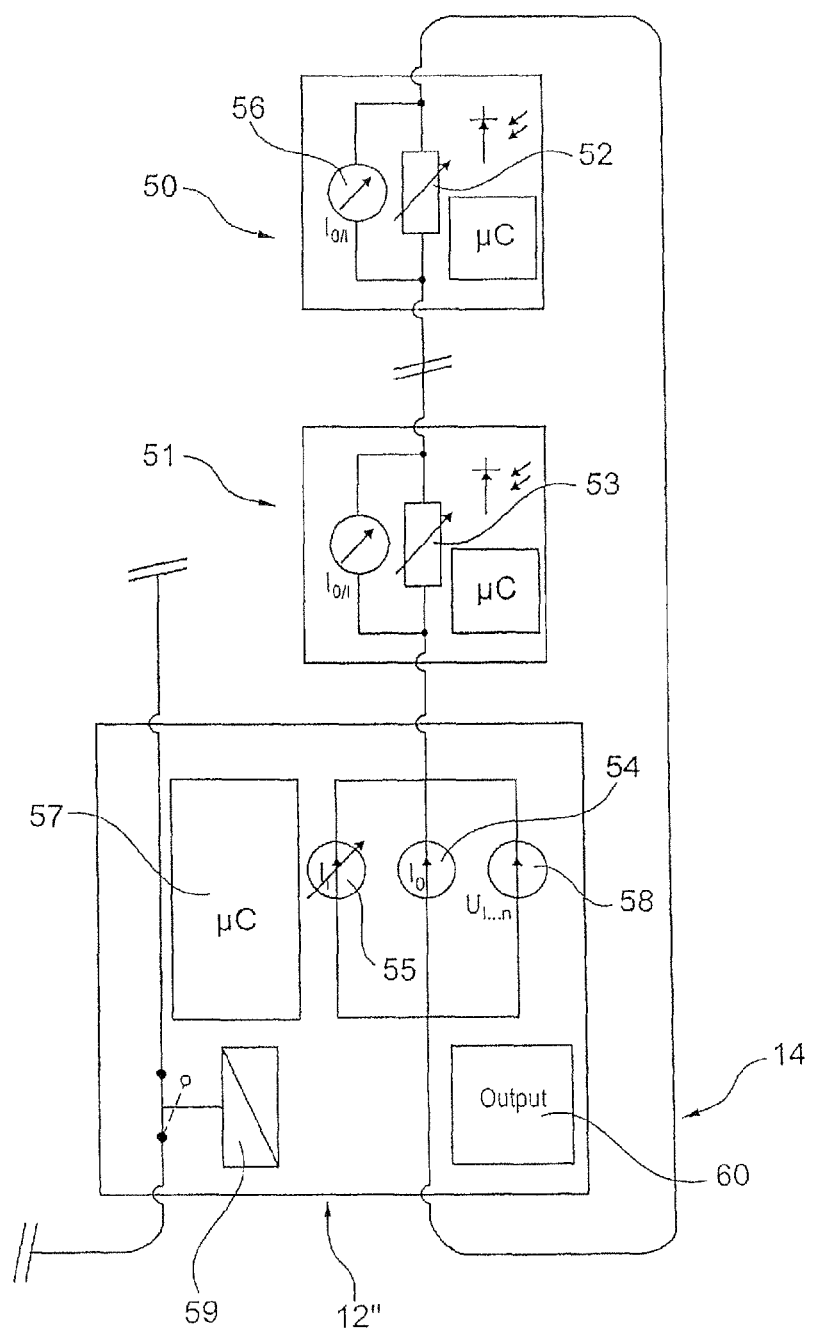
FIG. 16 shows a schematic illustration illustrating the way in which communication with individual sensors takes place in a safety apparatus in accordance with the invention.

FIG. 16 shows a schematic illustration of the communication in the safety circuit 14 between the controller 57 of the switching unit and the individual sensors 10 or microcontrollers μC thereof. The communication from the controller 57 to the individual sensors takes place via current modulation, while, conversely, that from the sensor 10 to the controller 57 takes place via voltage modulation.

It is generally necessary for notable current or voltage changes or modulations to take place since, owing to the long cable lengths occurring in an elevator system, the change would otherwise be unnoticeable. For example, current changes in the region of a factor of 3 are conceivable.

The units 50, 51 each correspond to a sensor. Variable resistors are denoted by the reference symbols 52, 53. Each sensor is assigned a variable resistor. The resistance can be changed in different ways: it is conceivable for resistors to be added into this circuit in parallel with other resistors, as a result of which the total resistance is correspondingly reduced. However, it is also conceivable for the resistance to be influenced by means of the circuitry used, for example by individual transistors being switched off. The change in resistance can be influenced optically, for example by means of phototransistors, photodiodes, optocouplers or the like.

The circuit comprises constant current sources 54, 55, which are each designed to match their voltage in the event of a change in the resistance in the circuit in such a way that a constant current flows. A change in the resistance (communication: controller 57 to sensor 10) regulates the constant current source 54 to a constant current intensity, with the result that the voltage measured via the voltmeter 56 changes.

If a further constant current source 55 is added into the circuit, the current intensity can also be modulated, i.e. the voltage does not remain constant (communication: sensor to controller). The change in the voltage applied to the circuit can be determined by the voltmeter 58.

The states of the individual sensors or other data relating to the sensors can therefore be output via an output 60. The relay 59 is controlled corresponding to the sensors via the microcontroller 57.

FIG. 16 illustrates a switching unit 12", as is also illustrated in FIG. 9 as switching unit 12 or in FIG. 10 as switching unit 12'. The switching unit 12' also comprises a voltage source. The switching unit 12 from FIG. 9 in particular also comprises the function of a relay, which can disconnect the motor M in the event of a line interruption as well. The switching unit 12 is connected to a (second) safety circuit 14 in FIG. 16.

LIST OF REFERENCE SYMBOLS

1 Sensor
1' Sensor
2 Contact receptacle
3 Contact bridge
3' Contact bridge
4 Transmitter
4' Fiberoptic conductor inlet
5 Receiver
5' Fiberoptic conductor outlet
6 Isolating web
7 Fitting unit
8 Fitting unit
9 Reflective surface
9a Reflective surface
9b Reflective surface
9c Reflective surface
10 Optical sensor
11 Electromechanical normally closed switch
12 Switching unit
12' Switching unit (with voltage source)
12" Switching unit
13 Voltage source
14 Second safety circuit
15 Contactor/relay
16 First safety circuit
20 Bus
21 Optical sensor with electronics unit
25 Switching unit
26 Safety circuit
27 Switching unit with integrated contactor
30 Circuit diagram
41 Sensor
42 Contact receptacle
43 Contact bridge
44 Fiberoptic conductor 45 Transmitter
46 Receiver
50 Communication unit
51 Communication unit
52 Variable resistor
53 Variable resistor
54 Constant current source
55 Constant current source
56 Voltmeter
57 Microcontroller of switching unit
58 Voltmeter
59 Relay
60 Output
A View at first time
B View at second time
C View at third time
D View at fourth time
K Cable/electrical line
L Fiberoptic conductor
M Drive motor
μC Microcontroller of a sensor
U Interruption

The invention claimed is:

1. A safety apparatus for elevator apparatuses which can move a cab by means of a drive, comprising:
   a first safety circuit that has a closed conduction state and an open conduction state, with an interrupting apparatus for interrupting the drive depending on the conduction state of the first safety circuit,
   a safety device comprising at least two sensors, which can be switched between at least two switching states depending on the closing state of an elevator door, and
   a switching unit that can be switched between at least two switching states by connection to the safety device to effect at least one of the closed and open conduction state of the first safety circuit,
   wherein the switching state of each sensor is indicated independent of the switching states of the at least two sensors.

2. A safety apparatus according to claim 1, wherein the safety device is in the form of a second safety circuit.

3. A safety apparatus according to claim 1, wherein the safety device is in the form of a bus system, the sensors each having an electronics unit which is connected to the bus, with the result that the switching states of at least one of the sensors and identification data of the sensors can be called up and transmitted via the bus.

4. A safety apparatus according to claim 1, wherein at least one of the sensors has a contact bridge and a contact receptacle for receiving the contact bridge, said contact bridge being arranged such that the closing state of the elevator door can be determined by connection of the contact receptacle and the contact bridge, the sensor being in the form of an optical sensor which comprises a transmitter for transmitting an optical signal and a receiver for receiving the optical signal, the transmitter and the receiver being arranged on the contact receptacle and the contact bridge comprising at least one transmission element for transmitting the optical signal.

5. A safety apparatus according to claim 1, wherein the first safety circuit comprises at least one electromechanical switch.

6. A safety apparatus according to claim 1, wherein at least two of the sensors are connected in series.

7. A safety apparatus according to claim 1, further comprising an indicator apparatus for displaying the switching state of the individual sensors with assignment of the individual switching states to the corresponding sensors.

8. A safety apparatus according to claim 1, further comprising an indicator apparatus that is connected to the bus and indicates, on the basis of the switching states and identification data, at least one of which sensors have which switching state and which sensor has a specific switching state.

9. A safety apparatus according to claim 1, wherein the switching unit performs communication with the sensors by at least one of modulation of the current intensity and the voltage.

10. A safety apparatus according to claim 1, wherein the sensor performs modulation of its internal resistance for communication with the switching unit.

11. An elevator apparatus with a cab and at least one elevator door for opening and closing the cab and with a safety apparatus for locking the elevator door during operation, wherein the safety apparatus and a sensor are provided according to claim 1.

12. The elevator apparatus according to claim 11, wherein the contact bridge is fitted to at least one of the elevator doors and the contact receptacle is fitted to the cab.

13. A method for retrofitting a safety apparatus according to claim 1 in an elevator apparatus.

14. The method according to claim 12, wherein the elevator apparatus further comprises a safety circuit with at least one normally closed switch for effecting an open or closed conduction state, wherein, in a first method step, the safety circuit is interrupted upstream and downstream of the normally closed switch.

15. The method according to claim 13, wherein, in a second method step, a safety device is introduced by virtue of the switching unit being used instead of the normally closed switch and the switching unit being connected to the safety device.

16. A retrofitting apparatus for retrofitting safety apparatuses of elevator apparatuses with safety circuits, said retrofitting apparatus comprising:
   a series circuit comprising normally closed switches,
   a safety device that comprises at least two sensors, wherein the sensors are switched between at least two switching states depending on the closing state of an elevator door, and
   a switching unit that can be switched between at least two switching states by connection to the safety device, wherein the switching unit is inserted into the safety circuit instead of at least one of the normally closed switches,
   wherein the switching state of each sensor is determinable by the switching unit independent of the switching states of the at least two sensors.

* * * * *